(12) United States Patent
Imamoto

(10) Patent No.: US 9,084,340 B2
(45) Date of Patent: Jul. 14, 2015

(54) ELECTRONIC DEVICE UNIT AND ELECTRONIC DEVICE

(71) Applicant: FUJITSU LIMITED, Kawasaki-shi, Kanagawa (JP)

(72) Inventor: Takashi Imamoto, Machida (JP)

(73) Assignee: FUJITSU LIMITED, Kawasaki (JP)

( * ) Notice: Subject to any disclaimer, the term of this patent is extended or adjusted under 35 U.S.C. 154(b) by 132 days.

(21) Appl. No.: 13/933,152

(22) Filed: Jul. 2, 2013

(65) Prior Publication Data

US 2014/0071640 A1    Mar. 13, 2014

(30) Foreign Application Priority Data

Sep. 7, 2012   (JP) ................................ 2012-197929

(51) Int. Cl.
    *H05K 5/00*          (2006.01)
    *H05K 7/14*          (2006.01)

(52) U.S. Cl.
    CPC ............ *H05K 5/0026* (2013.01); *H05K 7/1461* (2013.01)

(58) Field of Classification Search
    CPC .......... H05K 1/11; H05K 7/142; H05K 3/429
    USPC .................................... 361/792, 751, 679.02
    See application file for complete search history.

(56) References Cited

U.S. PATENT DOCUMENTS

| | | | |
|---|---|---|---|
| 2012/0293947 A1* | 11/2012 | Chen et al. ............... | 361/679.33 |
| 2013/0039006 A1* | 2/2013 | Li et al. .................... | 361/679.48 |
| 2013/0077218 A1* | 3/2013 | Zhang et al. ............. | 361/679.02 |
| 2013/0135805 A1* | 5/2013 | Wang ....................... | 361/679.02 |
| 2013/0229754 A1* | 9/2013 | Liu et al. .................. | 361/679.02 |

FOREIGN PATENT DOCUMENTS

| | | |
|---|---|---|
| JP | 01-145187 | 10/1989 |
| JP | 03-094718 | 9/1991 |
| JP | 08-213104 | 8/1996 |

* cited by examiner

*Primary Examiner* — Forrest M Phillips
(74) *Attorney, Agent, or Firm* — Fujitsu Patent Center

(57) ABSTRACT

An electronic device unit includes a frame member, a first board that is retained so as to be capable of moving with respect to the frame member in a horizontal direction of the frame member within a range restricted by a movement restricting portion, a first connector provided to the first board, a second board that faces the first board in the horizontal direction and that is positioned with respect to and fixed to the frame member; and a second connector that is provided to the second board and that is connected to the first connector in the fixed state of the second board.

15 Claims, 13 Drawing Sheets

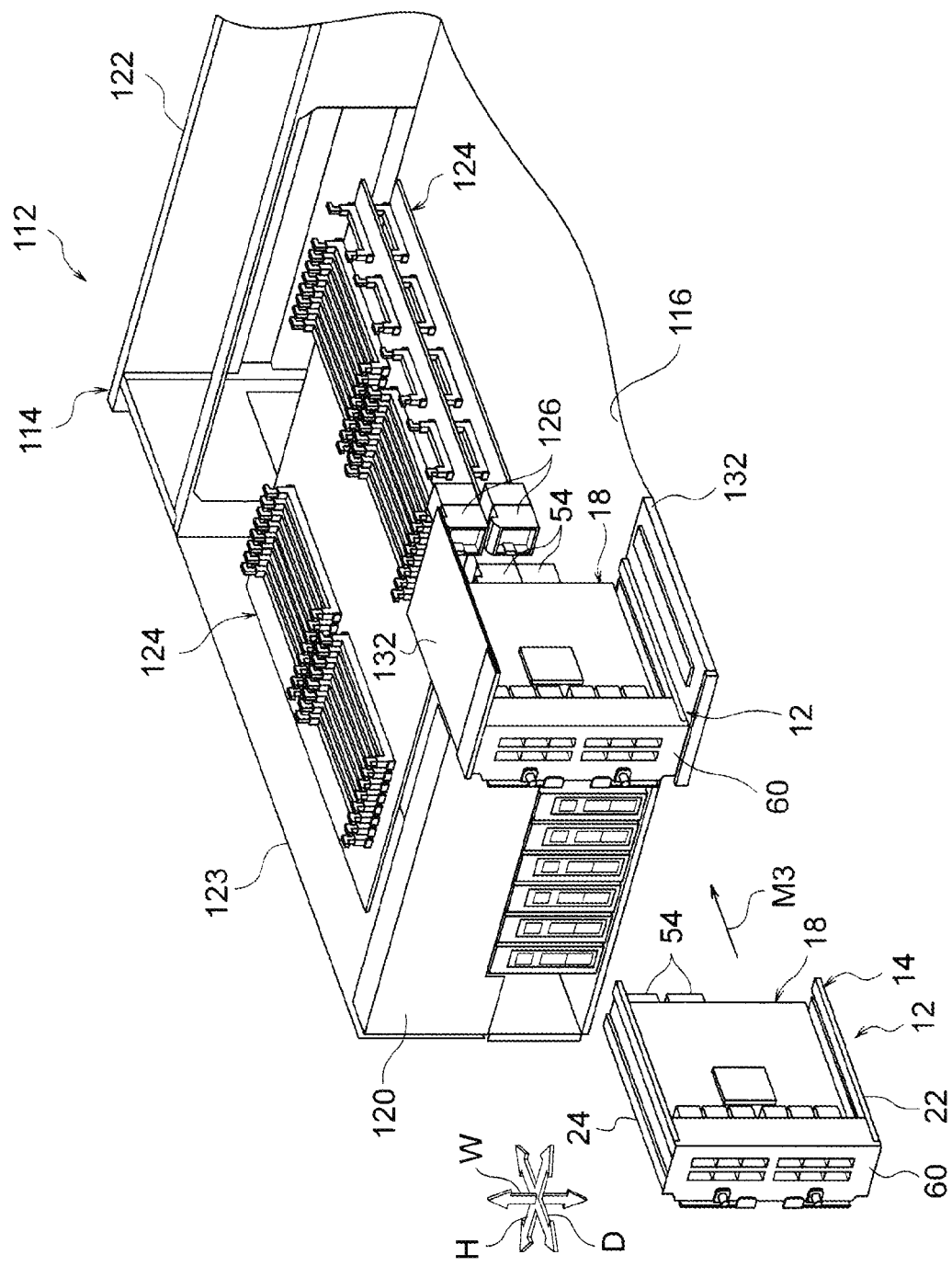

ELECTRONIC DEVICE UNIT AND ELECTRONIC DEVICE

CROSS-REFERENCE TO RELATED APPLICATION

This application is based upon and claims the benefit of priority of the prior Japanese Patent Application No. 2012-197929, filed on Sep. 7, 2012, the entire contents of which are incorporated herein by reference.

FIELD

The embodiments discussed herein are related to an electronic device unit and an electronic device.

BACKGROUND

Known structures in electronic devices, or electronic device units equipped with electronic devices, include two boards disposed so as to overlap with each other. These two boards are attached in sequence to a frame member and are connected together by respectively provided connectors.

In the above structure, in order to secure ease of connection to the board that is first attached to the frame member, the board that is later attached to the frame member is movable within a specific range with respect to the frame member. Namely, the attachment precision to the frame member of the board later attached to the frame member depends on the attachment precision of the board first attached to the frame member.

RELATED PATENT DOCUMENTS

Japanese Laid-Open Patent Publication No. 08-213104

SUMMARY

According to an aspect of the embodiments, an electronic device unit includes: a frame member; a first board that is retained so as to be capable of moving, with respect to the frame member, in a horizontal direction of the frame member within a range restricted by a movement restricting portion; a first connector provided to the first board; a second board that faces the first board in the horizontal direction and that is positioned with respect to and fixed to the frame member; and a second connector that is provided to the second board and that is connected to the first connector in the fixed state of the second board.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 11 is an exploded perspective view illustrating part of an electronic device of the first exemplary embodiment.

DESCRIPTION OF EMBODIMENTS

Detailed explanation follows regarding a first exemplary embodiment, with reference to the drawings.

Figure 1:
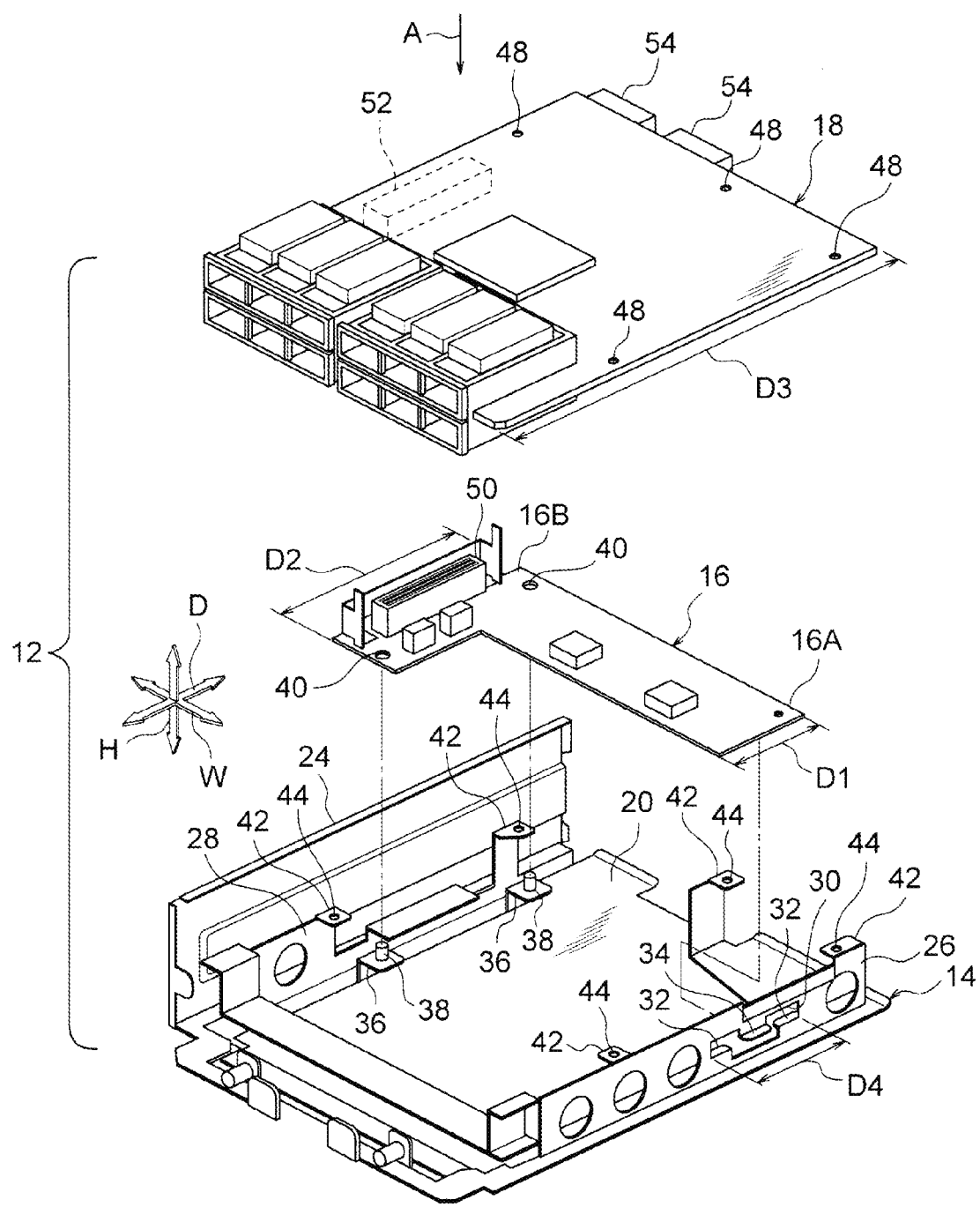
FIG. 1 is a perspective view illustrating an electronic device unit according to a first exemplary embodiment.
Figure 2:
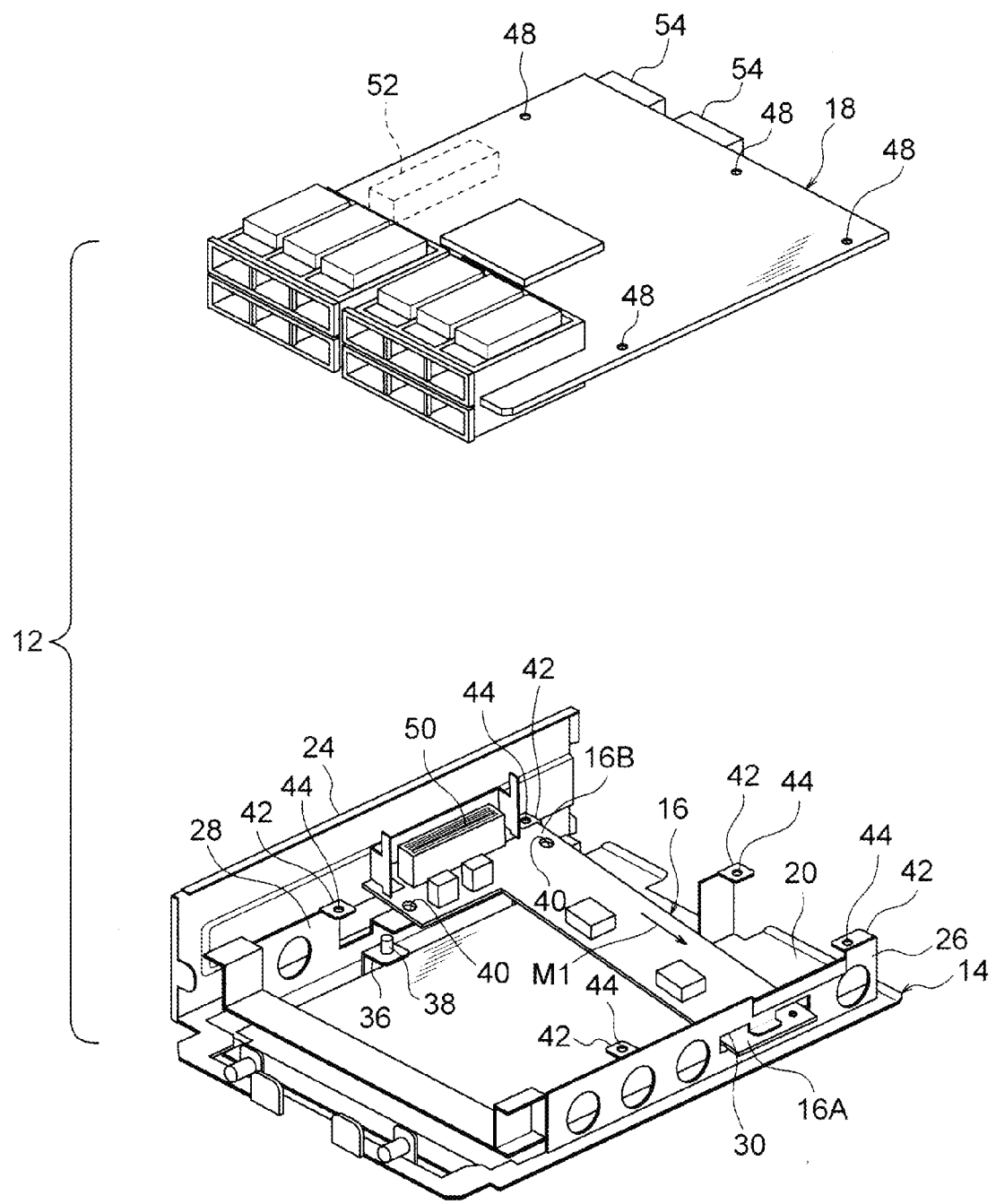
FIG. 2 is a perspective view illustrating an electronic device unit of the first exemplary embodiment in a state partway through assembly.

As illustrated in FIG. 1 and FIG. 2, an electronic device unit 12 of a first exemplary embodiment includes a frame member 14. As described in detail later, a first board 16 and a second board 18 are attached in sequence to the frame member 14. The first board 16 and the second board 18 are two boards that are provided in place of a single large board, and are divided according to function so as to be relatively small compared to such a large board.

In the drawings, the depth direction, width direction and height direction of the frame member 14 are indicated respectively by arrows D, W, H. When reference is made in the following simply to depth direction, width direction and height direction these respectively refer to the arrow D direction, W direction and H direction. The depth direction, width direction and directions that are a combination thereof are in the horizontal direction of the frame member 14.

Figure 9:
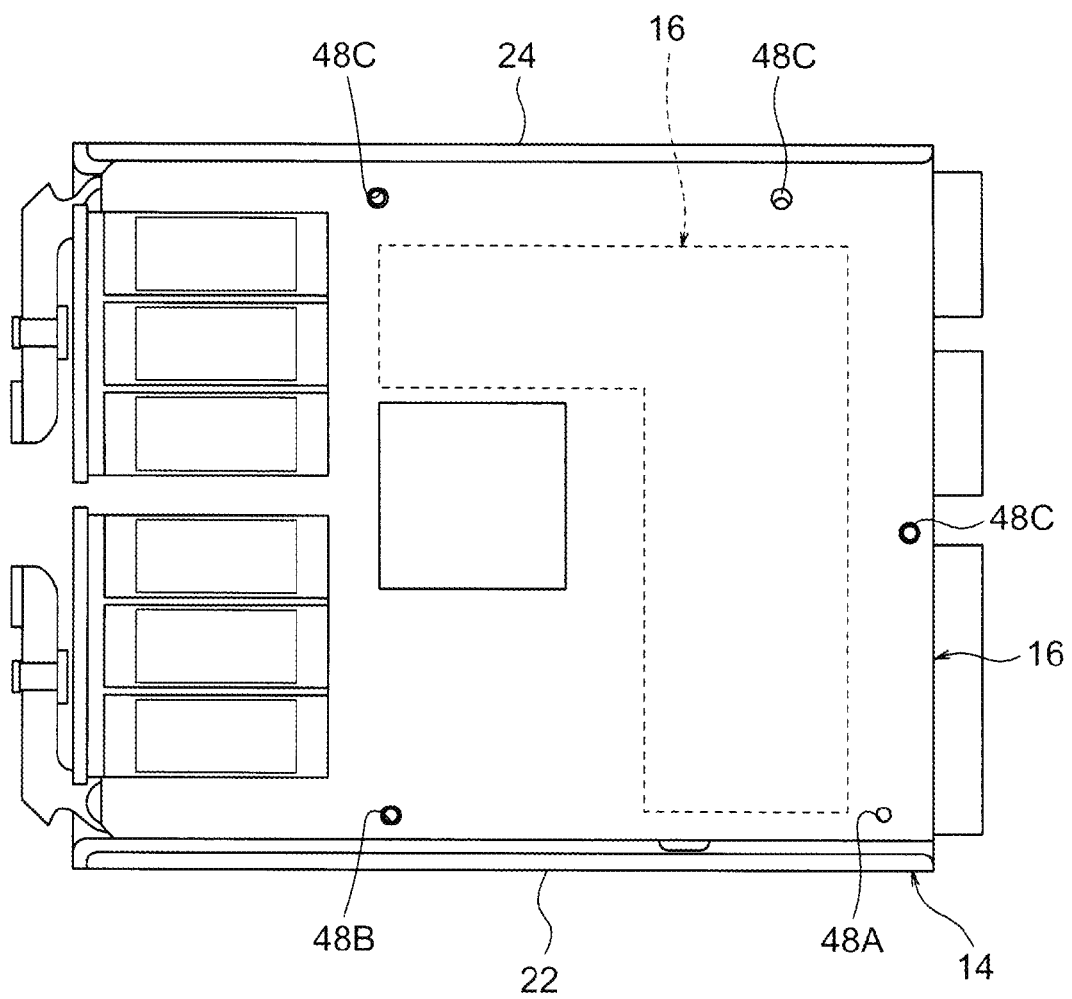
FIG. 9 is a plan view illustrating an electronic device unit of the first exemplary embodiment.

The frame member 14 in the present exemplary embodiment includes a substantially rectangular shaped bottom wall 20, and external frame walls 22, 24 that extend out from the bottom wall 20 along the length direction of the frame member 14 (one external frame wall 22 is omitted from illustration in FIG. 1 to FIG. 4, see FIG. 9). The bottom wall 20 configures a facing wall portion that faces towards the first board 16 in a state in which the first board 16 is attached to the frame member 14, as described later.

The first board 16 is formed in a substantially L-shape in plan view (viewed along the arrow A direction), and a depth D1 at one width direction end portion 16A side of the first board 16 is smaller than a depth D2 at another width direction end portion 16B. In contrast thereto, the second board 18 is formed in a substantially rectangular shape in similar plan view. The second board 18 has a depth D3 that is greater still than the depth D2 at the other width direction end portion 16B side of the first board 16.

Side wall portions 26, 28 are provided parallel to the external frame walls 22, 24, further to the width direction inside than the external frame walls 22, 24. The side wall portion 26 runs along an edge portion of the first board 16 on the one width direction end portion 16A side.

Figure 6:
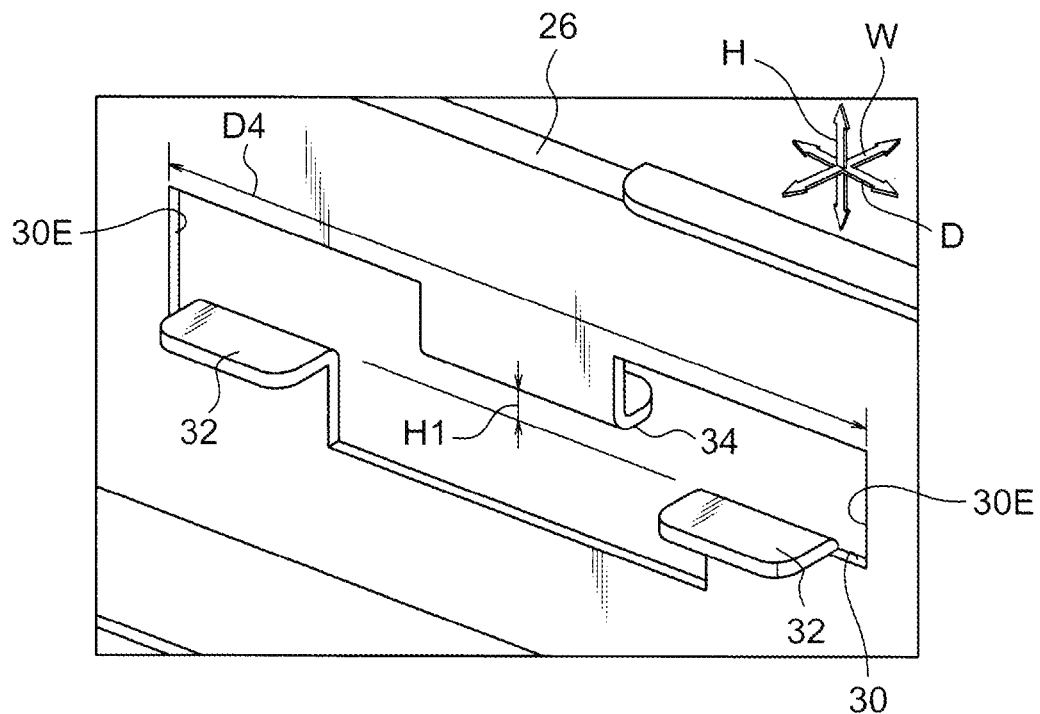
FIG. 6 is a perspective view illustrating part of an electronic device unit of the first exemplary embodiment as an enlargement in the vicinity of a housing hole.
Figure 7:
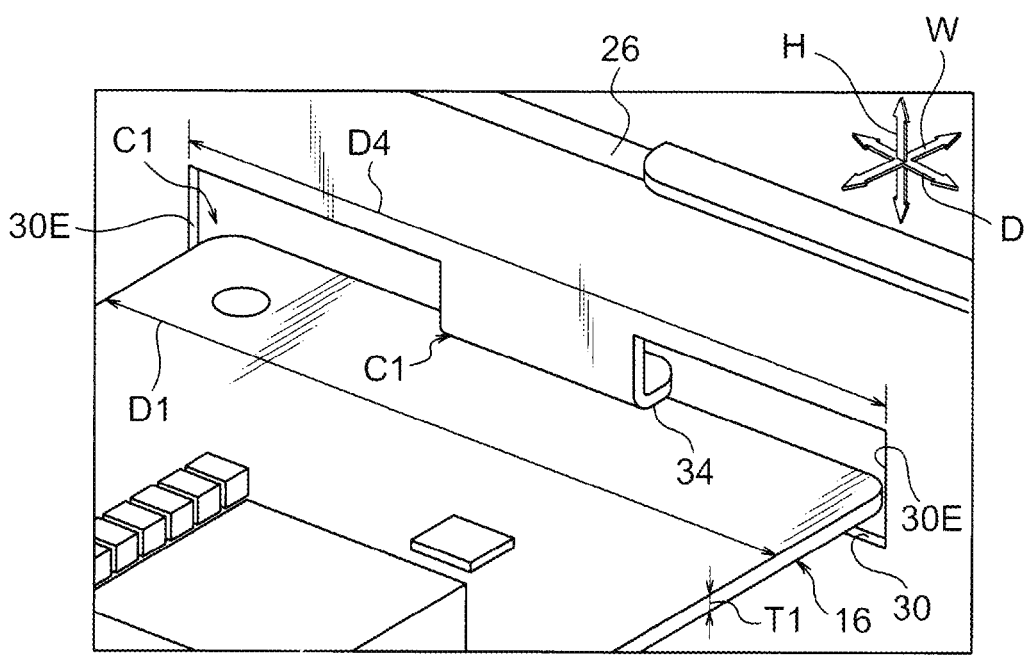
FIG. 7 is a perspective view illustrating part of an electronic device unit of the first exemplary embodiment as an enlargement of an inserted state of a first board.

A substantially rectangular shaped housing hole 30 is provided in the side wall portion 26, so as to pierce through the side wall portion 26 in the frame member 14 width direction (the arrow W direction). As illustrated in FIG. 6 and FIG. 7, an opening length D4 of the housing hole 30 (opening length in the arrow D direction) is slightly longer than the depth D1 at the one width direction end portion 16A side of the first board 16. An opening height H1 (opening height in the arrow H direction) of the housing hole 30 is slightly higher than a thickness T1 of the first board 16.

The one width direction end portion 16A of the first board 16 is accordingly capable of being housed in the housing hole 30. In the housed state, a clearance C1 is present between the one width direction end portion 16A side of the first board 16 and the housing hole 30 along directions orthogonal to the opening direction (in the depth direction and the height direction). The one width direction end portion 16A side of the first board 16 is accordingly movable in the depth direction and the height direction within the range of the clearance C1. Movement of the first board 16 in the depth direction is restricted by contact of a portion of the first board 16 with lateral hole edges 30E of the housing hole 30. The housing hole 30 is an example of a movement restricting portion (contact portion).

As illustrated in FIG. 6, bearing portions 32 are formed from a lower edge portion of the housing hole 30 towards the width direction inside. Similarly, a stopper 34 is formed from an upper edge portion of the housing hole 30 towards the width direction outside. The bearing portions 32 and the stopper 34 respectively face towards the lower side and the upper side of the portion of the first board 16 housed in the housing hole 30. In particular, the bearing portions 32 support the portion of the first board 16 housed in the housing hole 30 from the lower side by face-to-face contact. Correspondingly, the stopper 34 makes face-to-face contact with the first board 16 when the portion of the first board 16 housed in the housing hole 30 moves upwards, thereby restricting such movement. In practice the bearing portions 32 and the stopper 34 operate as movement restricting portions (contact portions).

In the present exemplary embodiment, due to the face-to-face contact of the bearing portions 32 and the stopper 34, the load acting locally on the first board 16 is smaller than in a structure not formed with the bearing portions 32 and the stopper 34 (in which an upper edge portion and a lower edge portion of the housing hole 30 make line shaped contact with the first board 16).

Moreover, in the present exemplary embodiment, the bearing portions 32 and the stopper 34 are formed by cutting around portions for the bearing portions 32 and the stopper 34 when forming the housing hole 30 in the side wall portion 26, and then fold-bending the cut-around portion. There is accordingly no need to provide a new member to form the bearing portions 32 or the stopper 34, and the number of components is suppressed from increasing.

Note that in the present exemplary embodiment, the opening height H1 of the housing hole 30 is in practice the separation between the upper face of the bearing portions 32 and the lower face of the stopper 34 (see FIG. 6).

As illustrated in FIG. 1, plural (at least 2 in the present exemplary embodiment) first support bases 36 are provided on the bottom wall 20 so as to face upwards. Pins 38 project out upwards from the respective first support bases 36, namely in a direction normal to the bottom wall 20 (facing wall portion) (the arrow H direction).

Figure 8:
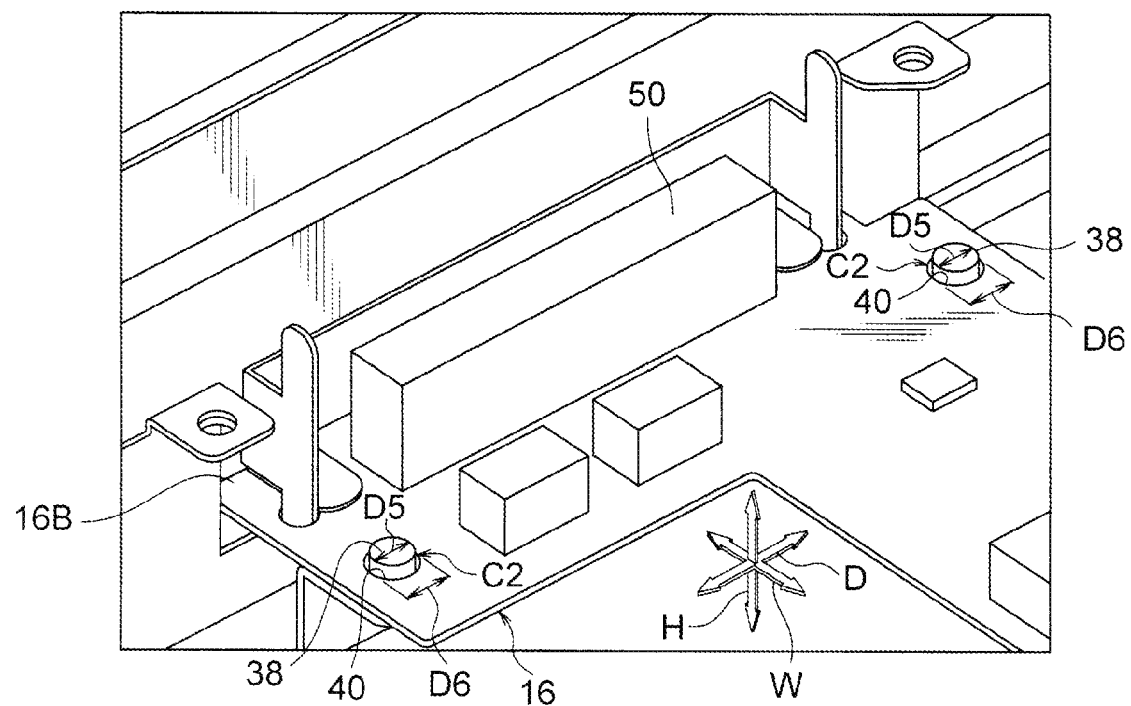
FIG. 8 is perspective view illustrating part of an electronic device unit of the first exemplary embodiment as an enlargement in the vicinity of pins and insertion holes.

As illustrated in detail in FIG. 8, in the present exemplary embodiment the respective pins 38 are circular column shaped and have a specific diameter D5 (for example about 4.2 mm). Moreover, in the present exemplary embodiment, the pins 38 are provided at positions in the vicinity of the side wall portion 28 (positions away from the side wall portion 26).

The same number of insertion holes 40 are formed in the first board 16 as the number of pins 38. The respective insertion holes 40 are formed in positions corresponding to the pins 38 when the first board 16 is disposed in a specific position with respect to the frame member 14. The respective insertion holes 40 are respectively formed in a circular shape with a specific internal diameter D6 (for example about 5.2 mm) that is larger than the diameter D5 of the pins 38. The pins 38 are inserted into the corresponding respective insertion holes 40 when the first board 16 is in an attached state to the frame member 14.

Figure 3:
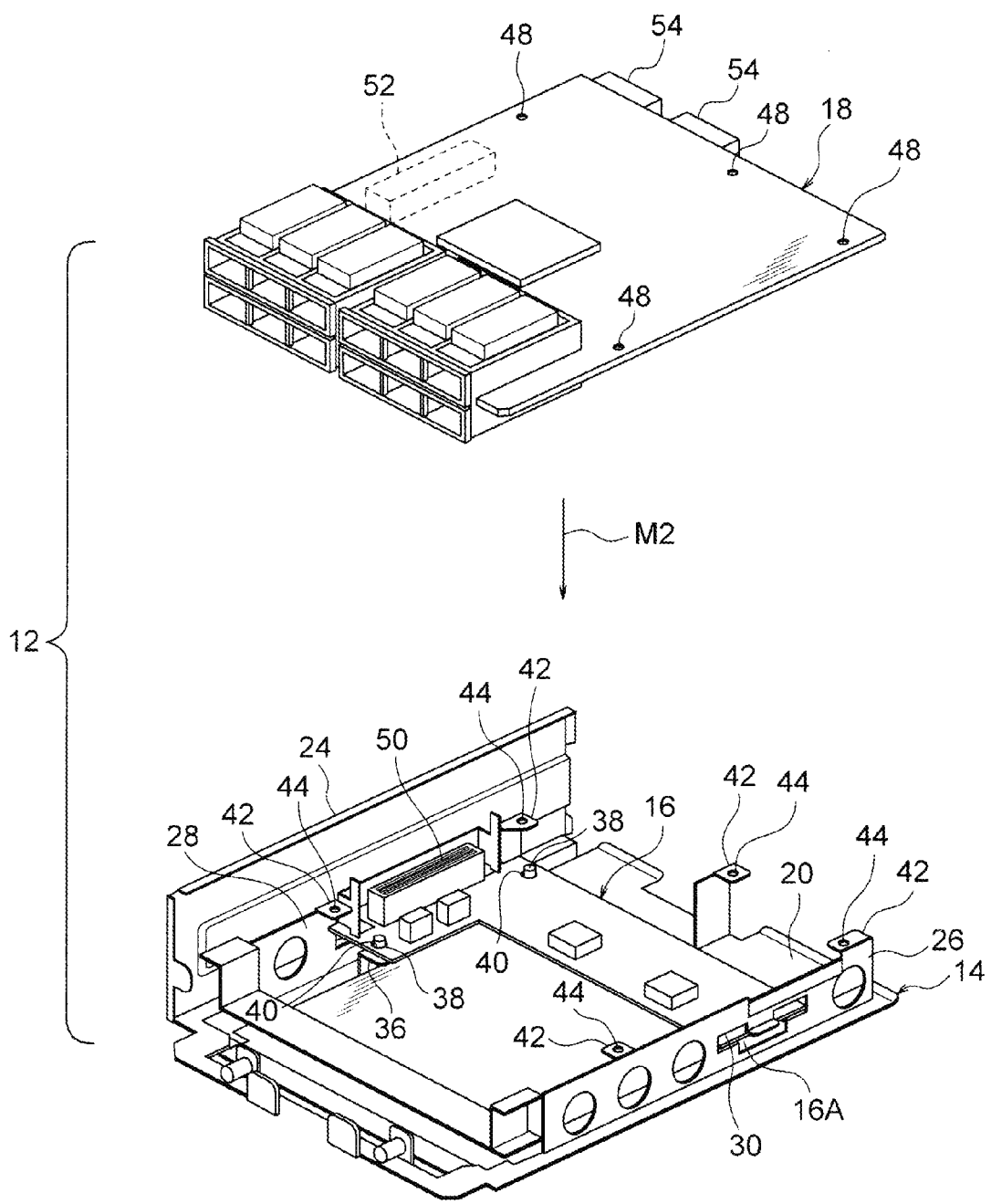
FIG. 3 is a perspective view illustrating an electronic device unit of the first exemplary embodiment in a state partway through assembly.

The internal diameter D6 of the insertion holes 40 is slightly larger than the diameter D5 of the pins 38. Consequently, a clearance C2 arises between the outer peripheral face of the pins 38 and the inner peripheral face (the smallest internal diameter portions) of the insertion holes 40 even when the whole of the pins 38 are inserted into the insertion holes 40, as illustrated in FIG. 3. Namely, the pins 38 having clearance to the insertion holes 40 enables the other width direction end portion 16B side of the first board 16 to be moved in the horizontal direction within the range of the clearance C2. Movement of the first board 16 in the horizontal direction is restricted when the internal edges of the insertion holes 40 make contact with the pins 38. The pins 38 are examples of movement restricting portions (contact portions).

Figure 15:
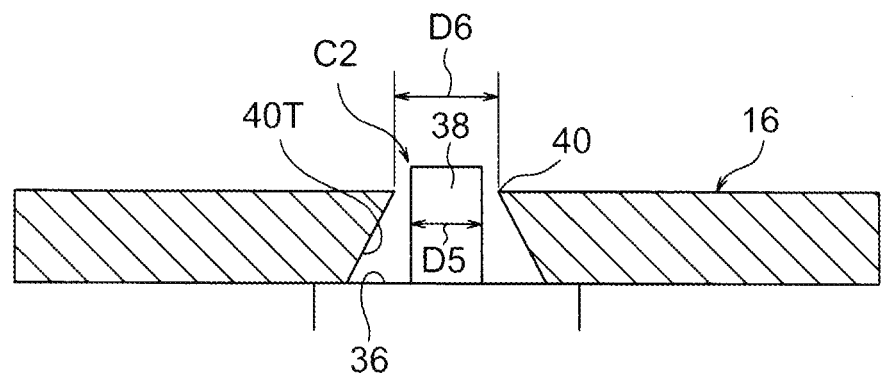
FIG. 15 is a cross-section of a first board illustrating a modified example of an insertion hole and a pin of an electronic device of the first exemplary embodiment.
Figure 16:
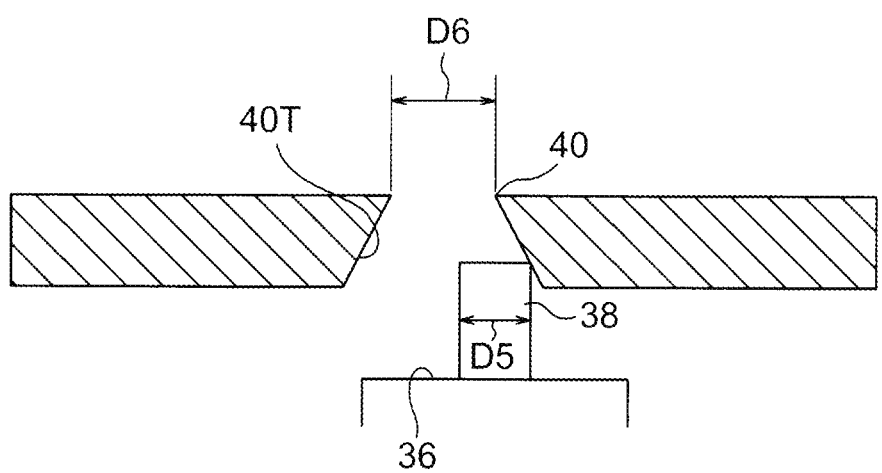
FIG. 16 is a cross-section of a first board illustrating a modified example of an insertion hole and a pin of an electronic device of the first exemplary embodiment.

Note that, as illustrated in FIG. 15, a structure may be employed for the insertion holes 40 with sloping faces 40T on the inner peripheral face of the insertion holes 40 such that the internal diameter gradually decreases on progression from a lower portion (at the pins 38 insertion direction near side) towards an upper portion (the pins 38 insertion direction far side). In such a structure, as illustrated in FIG. 16, even if there is some misalignment between the centers of the insertion holes 40 and the centers of the pins 38 when the pins 38 are being inserted into the insertion holes 40, the other width direction end portion 16B side of the first board 16 is moved by the sloping faces 40T in the direction to align the centers. In such a structure, the internal diameter is smallest at the upper end portion of the insertion holes 40 provided with the sloping faces 40T, and the internal diameter of the upper end portion may be set such that the clearance C2 described above is formed between the upper edge portion and the pins 38

Moreover, positional misalignment between the centers of the insertion holes 40 and the centers of the pins 38 can also be eliminated by employing a constant internal diameter for the insertion holes 40, and employing a tapered shape for the pins 38 with the outer diameter gradually reducing on progression towards the leading end.

By so doing, the first board 16 is retained by the frame member 14 so as to be capable of moving in the horizontal direction in a state in which the one width direction end portion 16A side of the first board 16 is housed in the housing hole 30 and the pins 38 have been inserted into the insertion holes 40 of the first board 16. Moreover, the first board 16 is capable of moving in the height direction (thickness direction) within the range of the clearance C1. In particular, the other width direction end portion 16B side is capable of pivoting about the one width direction end portion 16A side so as to incline the first board 16.

Figure 4:
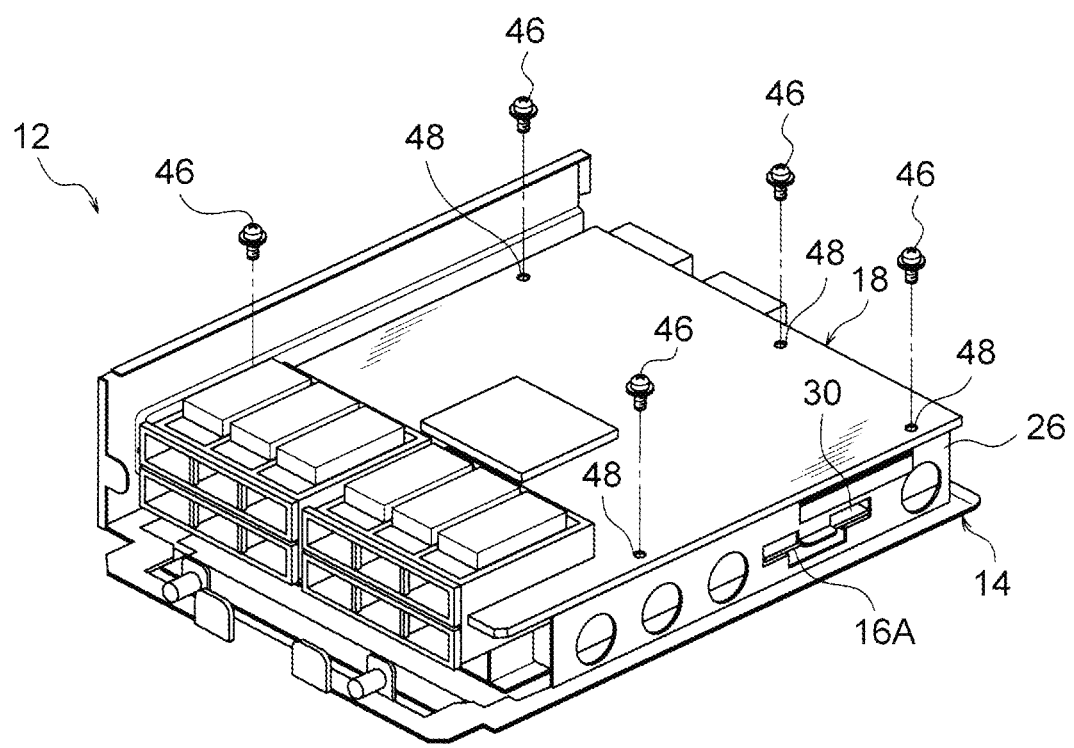
FIG. 4 is a perspective view illustrating an electronic device unit of the first exemplary embodiment in a state partway through assembly.
Figure 5:
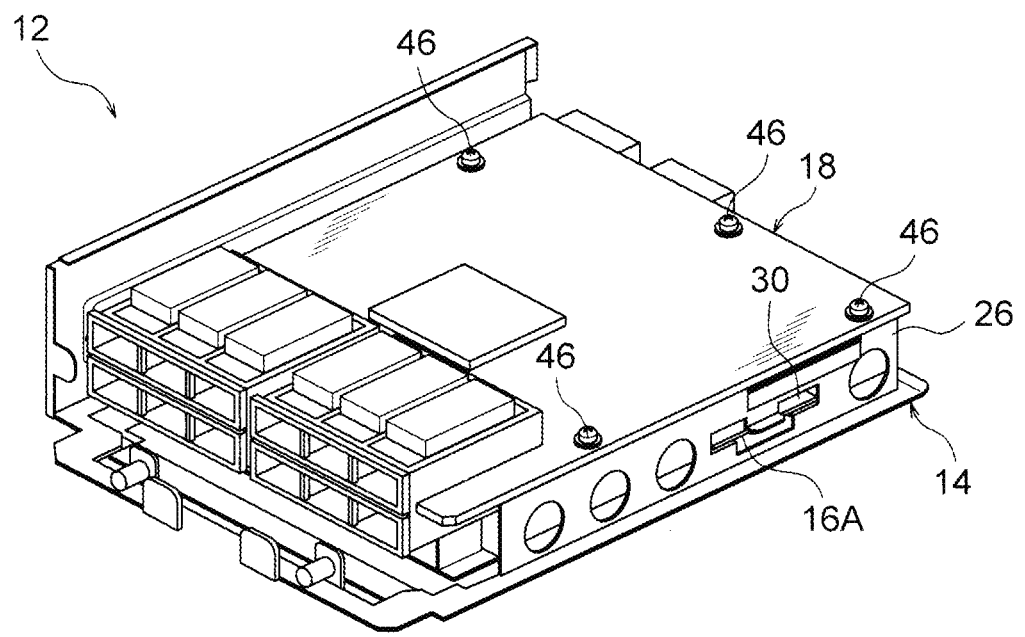
FIG. 5 is a perspective view illustrating an electronic device unit of the first exemplary embodiment.

As illustrated FIG. 1, plural (5 in the present exemplary embodiment) second support bases 42 are provided to the bottom wall 20 and the side wall portions 26, 28 so as to extend out towards the width direction inside. Female threads 44 are formed in the respective second support bases 42. As illustrated in FIG. 4 and FIG. 5, attachment screws 46 (male threads) are screwed into the respective female threads 44 in order to fix the second board 18 to the frame member 14.

The same number of screw holes 48 are formed in the second board 18 as the number of attachment screws 46. The second board 18 is disposed in the horizontal direction facing towards the first board 16 when disposed in a specific position of the frame member 14. In particular in the present exemplary embodiment the second board 18 is parallel to the first board 16. The screw holes 48 are respectively aligned with corresponding specific female threads 44. This accordingly enables the second board 18 to be fixed to a specific position of the frame member 14 by inserting the attachment screws 46 through the screw holes 48 and screwing into the female threads 44.

In particular in the present exemplary embodiment, there are three types of hole provided as the screw holes 48, a single circular reference hole 48A, a single oblong reference hole 48B and plural (3 in the illustrated example) circular fixing holes 48C.

Figure 10A:
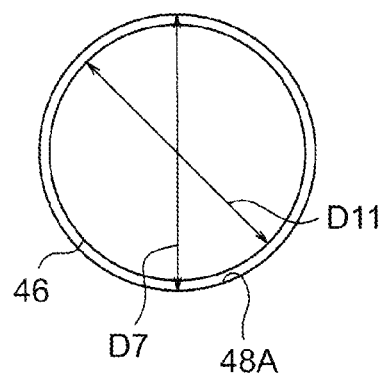
FIG. 10A is a plan view illustrating the relationship between diameters of a screw hole (circular reference hole) and an attachment screw in an electronic device unit of the first exemplary embodiment.
Figure 10B:
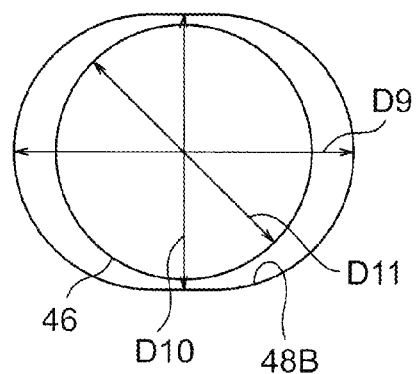
FIG. 10B is a plan view illustrating the relationship between diameters of a screw hole (oblong reference hole) and an attachment screw in an electronic device unit of the first exemplary embodiment.
Figure 10C:
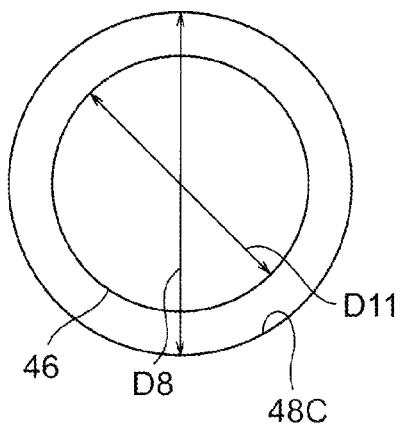
FIG. 10C is a plan view illustrating the relationship between diameters of a screw hole (circular fixing hole) and an attachment screw in an electronic device unit of the first exemplary embodiment.

As illustrated in FIG. 10A to FIG. 10C, an internal diameter D7 of the circular reference hole 48A is slightly larger than a diameter D11 of the attachment screws 46, and an internal diameter D8 of the circular fixing holes 48C is larger than the internal diameter D7 of the circular reference hole 48A. Moreover, the oblong reference hole 48B has a long direction internal dimension D9 that is about the internal diameter of the circular fixing holes 48C, and a short direction internal dimension D10 that is about the internal diameter of the circular reference hole 48A, with the long direction of the oblong reference hole 48B aligned in a radial direction centered on the circular reference hole 48A. Specifically, for example when the diameter D11 of the attachment screws 46 is about 3.0 mm, the internal diameter D7 of the circular reference hole 48A is about 3.2 mm, and when the internal diameter D8 of the circular fixing holes 48C is about 4.0 mm then the internal dimensions of the oblong reference hole 48B are set at about 3.2 mm×4.0 mm.

As illustrated in FIG. 1 to FIG. 3, a first connector 50 is attached to the first board 16. Correspondingly, a second connector 52 that is connectable to the first connector 50 is attached to the second board 18. The first board 16 that is first retained on the frame member 14 is accordingly movable as appropriate in the depth direction (the arrow D direction) and the width direction (the arrow W direction) during fixing of the second board 18 to the frame member 14. It is then possible to align the position of the first connector 50 with the second connector 52 as viewed in the arrow A direction by moving the first board 16.

In particular in the present exemplary embodiment the first connector 50 and the second connector 52 are both oriented in the same direction as each other along the direction the first board 16 faces the bottom wall 20. Consequently, the first connector 50 and the second connector 52 can be connected together by a simple movement of the first board 16 to approach the second board 18 in a positionally aligned state of the first connector 50 with respect to the second connector 52.

In the present exemplary embodiment, the first connector 50 is provided on the other width direction end portion 16B side of the first board 16 (the opposite side to that of the one width direction end portion 16A). Due to the first connector 50 being positioned on the opposite side of the first board 16 to the side housed in the housing hole 30, the first connector 50 on the other width direction end portion 16B side can be moved about a movement pivot point of the one width direction end portion 16A side housed in the housing hole 30.

The electronic device unit 12 of the present exemplary embodiment, as described above, includes the frame member 14, and the first board 16 and the second board 18 that are attached to the frame member 14. As illustrated in FIG. 11, the electronic device unit 12 is attached to a casing 114 of the electronic device 112. Note that, a cover 60 can be installed to the frame member 14 prior to attaching the electronic device unit 12 to the casing 114.

The casing 114 of the electronic device 112 is formed in a substantially rectangular box shape, with the substantially rectangular box shape formed with a bottom wall 116, a top wall 118 (see FIG. 12), a rear wall 120, a front wall 122 and two side walls 123 (the side wall on the near side is omitted in the drawing).

In the casing 114, plural (two in the illustrated example, however configuration may be made with 1) third boards 124 are each mounted so as to be parallel to the bottom wall 116. The third boards 124 are examples of attached-to members. However, an attached-to member is not limited to such boards.

In an attached state of the frame member 14 to the casing 114, the first board 16 and the second board 18 are orthogonal to the third boards 124 as viewed in the depth direction (the arrow D direction). Namely, the orientation of the electronic device unit 12 (the frame member 14) is illustrated in FIG. 11 at 90 degrees to the orientation in FIG. 1 to FIG. 4.

Third connectors 54 are attached to the second board 18. Correspondingly, a fourth connector 126 that is connectable to the third connector 54 is attached to each of the third boards 124. As illustrated in FIG. 11, the sliding direction of the frame member 14 and the connection direction of the third connectors 54 and the fourth connectors 126 are aligned with each other (in the arrow M3 direction). This accordingly enables the third connectors 54 and the fourth connectors 126 to be connected together by sliding the frame member 14 in the depth direction with respect to the casing 114.

A upper-lower pair of rail plates 132 are provided to the bottom wall 116 and the top wall 118 of the casing 114 at the position where the electronic device unit 12 is attached. As illustrated in detail in FIG. 12 and FIG. 13, rail protrusions 128 are formed on the respective rail plates 132 so as to run along the frame member 14 sliding direction (the arrow A1 direction) and protrude locally towards the casing 114 inside.

Figure 12:
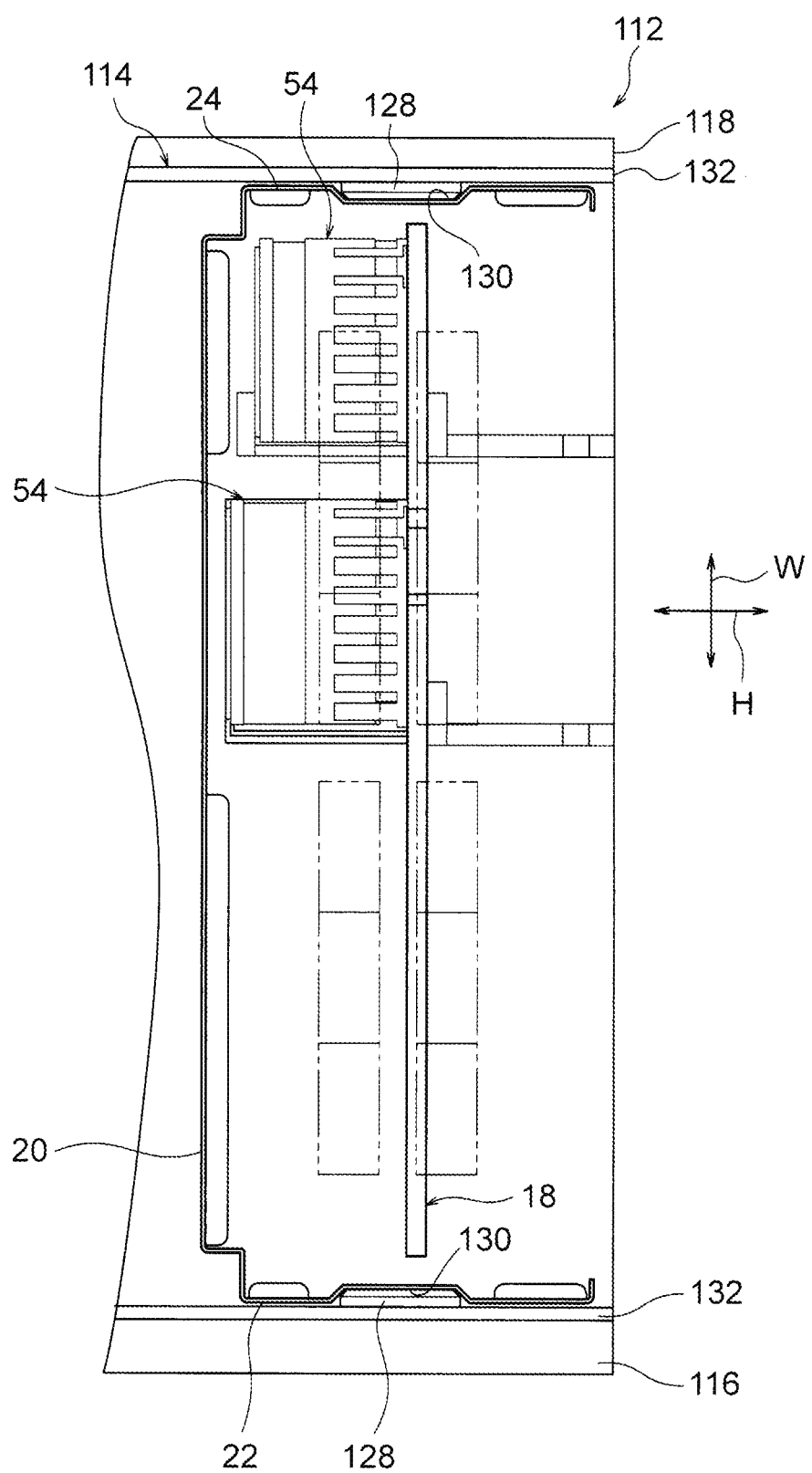
FIG. 12 is a face-on view illustrating part of an electronic device of the first exemplary embodiment.
Figure 13:
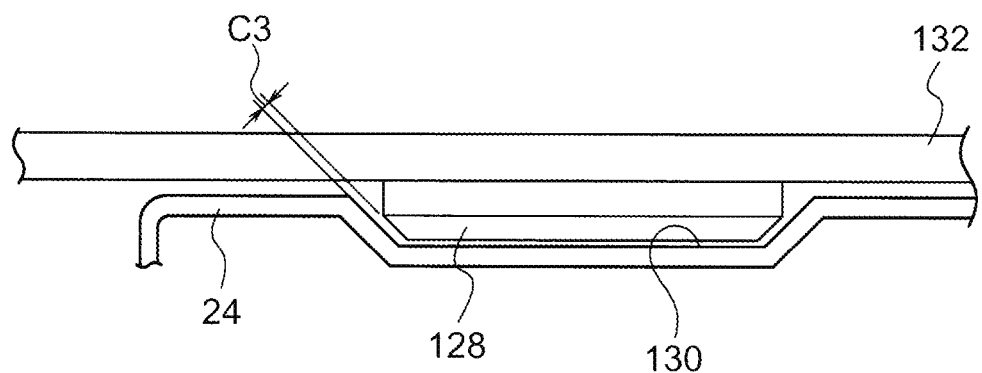
FIG. 13 is an enlarged face-on view illustrating part of an upper portion of an electronic device of the first exemplary embodiment in the vicinity of a rail plate.
Figure 14:
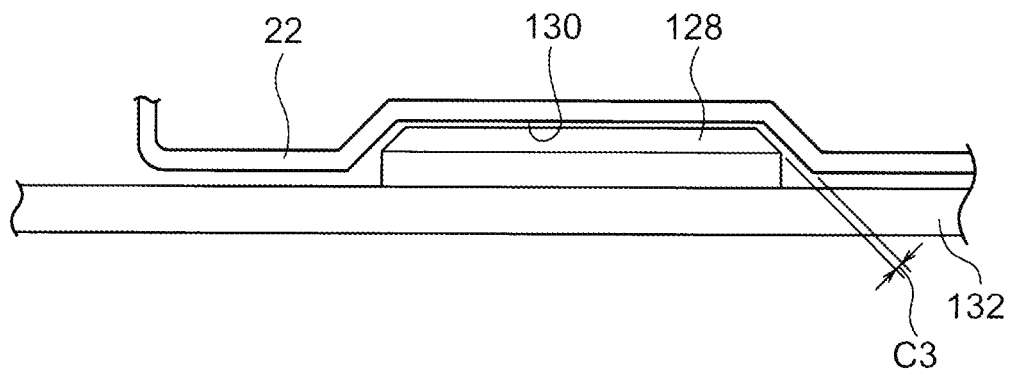
FIG. 14 is an enlarged face-on view illustrating part of a lower portion of an electronic device of the first exemplary embodiment in the vicinity of a rail plate

The rail protrusions 128 are disposed facing the frame member 14 and sandwiching the frame member 14 from both width direction sides (the top and bottom in FIG. 12). Correspondingly, rail indentations 130 that house the rail protrusions 128 are formed in the side wall portions 26, 28 of the frame member 14 along the sliding direction of the frame member 14. There is a specific clearance C3 (for example about 0.5 mm) present between the rail protrusions 128 and the rail indentations 130 when the rail protrusions 128 are in a housed state in the rail indentations 130. Consequently, variation in the relative position of the third connectors 54 and the fourth connectors 126, and variation in the relative position of the frame member 14 and the casing 114 is absorbable. Due to the frame member 14 being guided in the sliding direction whilst maintaining a specific positional relationship with respect to the casing 114, unintended rattling about of the frame member 14 is suppressed during sliding. The positioning precision when connecting together the third connectors 54 and the fourth connectors 126 is accordingly raised. The rail protrusions 128 are examples of guide members.

As illustrated in FIG. 11, the third connectors 54 and the fourth connectors 126 have a structure with connection in mutually orthogonal board directions as viewed along the connection direction (the arrow M3 direction) (called orthogonal connectors). The second board 18 and the third boards 124 are accordingly orthogonal to each other as viewed along the connection direction (the arrow D direction). In addition the connection direction between the third connectors 54 and the fourth connectors 126 is the same direction as the sliding direction (the horizontal direction) of the frame member 14 with respect to the casing 114.

Explanation next follows regarding an attachment method of the first board 16 and the second board 18 to the electronic device unit 12 of the present exemplary embodiment, an attachment method of the electronic device unit 12 to the casing 114, and operation of the electronic device unit 12 and the electronic device 112.

To obtain the electronic device unit 12, first, as illustrated in FIG. 2, the one width direction end portion 16A side of the first board 16 is inserted in the arrow M1 direction into the housing hole 30 from inside the frame member 14. The clearance C1 is present between the housing hole 30 (the bearing portions 32 and the stopper 34) and the first board 16. The one width direction end portion 16A side of the first board 16 is accordingly easily insertable
into the housing hole 30. It is then possible to move the first board 16 in the arrow M1 direction until the one width direction end portion 16A side of the first board 16 contacts the external frame wall 22 (see FIG. 9). At this stage the first board 16 is slightly tilted such that the other width direction end portion 16B is higher.

Then the other width direction end portion 16B of the first board 16 is lowered, and the pins 38 are inserted into the corresponding insertion holes 40. Insertion is easy due to the respective insertion holes 40 each having the specific internal diameter D6 that is larger than the diameter D5 of the pins 38. At this stage the first board 16 is temporarily supported on the first support bases 36.

Moreover, in addition to the clearance C1 between the housing hole 30 and the first board 16, there is also the clearance C2 present between the pins 38 and the insertion holes 40. Consequently, the first board 16 is retained so as to be movable with respect to the frame member 14 in the depth direction (the arrow D direction) and the width direction (the arrow W direction) within the range of the clearances C2 and C1.

Next, as illustrated in FIG. 3, the second board 18 is moved close to the first board 16 from above (in the arrow M2 direction) such the first connector 50 and the second connector 52 are fitted together and connected. The screw holes 48 and the female threads 44 are substantially positionally aligned with each other at this stage.

The attachment screws 46 are then inserted through the screw holes 48 and screwed into the female threads 44 so as to fix the second board 18 to the frame member 14. When this is performed, first one of the attachment screws 46 is inserted into the circular reference hole 48A and provisionally fixed to the female thread 44. "Provisionally fixed" means that the second board 18 is not completely fixed to the frame member 14, enabling the second board 18 to rotate about the circular reference hole 48A.

One of the attachment screws 46 is then inserted into the oblong reference hole 48B. As described above, the second board 18 is rotatable about the circular reference hole 48A, and the oblong reference hole 48B is also oblong with a length direction aligned with the radial direction of the circular reference hole 48A. This accordingly enables misalignment in positions of the oblong reference hole 48B and the female thread 44 to be accommodated. At this point the attachment screws 46 are then screwed fully into the female threads 44.

Fixing is then completed by re-screwing the attachment screw 46 that had been provisionally fixed into the circular reference hole 48A. The second board 18 is accordingly fixed in a positionally aligned state to the frame member 14 using the attachment screw 46 inserted through the circular reference hole 48A and the attachment screw 46 inserted into the oblong reference hole 48B. In particular in the present exemplary embodiment, as an example, for a diameter D11 of the attachment screws 46 of 3 mm, the internal diameter D7 of the circular reference hole 48A is 3.2 mm, resulting in a gap of 0.2 mm. It is accordingly possible to fix the second board 18 to the frame member 14 with high positioning precision.

Then the attachment screws 46 are passed through the respective circular fixing holes 48C and fully fastened into the female threads 44. The second board 18 is thereby more strongly fixed to the frame member 14. The internal diameter D8 of the circular fixing holes 48C is larger than the internal diameter D7 of the circular reference hole 48A, enabling positional misalignment between the circular fixing holes 48C and the female threads 44 to be accommodated, and enabling the attachment screws 46 to be screwed into the female threads 44.

In the above, the second board 18 is positionally aligned with and fixed to the frame member 14 with a high positioning precision. In contrast, the first board 16 is not fixed to the frame member 14 by screws or the like, and is instead retained so as to be movable in the depth direction and the width direction within the range of the clearances C2, C1. Namely, when the second board 18 is being positionally aligned with and fixed to the frame member 14, the first board 16 moves with respect to the frame member 14 so as to follow the second board 18. The position of the first board 16 is accordingly suppressed from influencing the position of the second board 18, enabling the second board 18 to be fixed with a high positioning precision with respect to the frame member 14.

Attachment operation of the first board 16 to the frame member 14 is then completed by fixing the second board 18 to the frame member 14, such that the first board 16 is in a sandwiched state between the frame member 14 and the second board 18.

In the electronic device unit 12 of the present exemplary embodiment there are two boards (the first board 16 and the second board 18) attached to the frame member 14 in an overlapping state in the thickness direction. The board size increases when a single large board is employed in place of the two boards, however in the present exemplary embodiment there are smaller respective board surface areas. The two small surface area boards overlap with each other and thereby enable a high mounting density of electronic components and a smaller electronic device unit 12 to be achieved even in a more confined space.

As explained above, in the present exemplary embodiment, first the first board 16 is retained on the frame member 14 so as to be moveable in the depth direction and width direction. Then, the second board 18 is positionally aligned with and fixed to the frame member 14 in a connected state of the first connector 50 and the second connector 52. This enables the positioning precision of the second board 18 with respect to the frame member 14 to be secured at a high level, without depending on the first board 16.

In particular, the housing hole 30 and the pins 38 are provided as movement restricting portions that make contact with the first board 16. Such a simple structure enables horizontal direction movement of the first board 16 with respect to the frame member 14 to be restricted to a specific range. Moreover, the movement restricting portion is not limited to the housing hole 30 and the pins 38, and configuration may be made with, for example, a projection and/or a wall that make contact with the first board 16 when it has moved in the horizontal direction, thereby restricting such movement. In addition, a movement restricting portion is not limited to a structure that restricts movement in the horizontal direction by contacting the first board 16. For example, movement of the first board may be restricted using a spring force (effectively restricting movement of the first board 16 by the spring force increasing as the first board 16 moves from a specific position).

Here, as a first comparative example, consider a structure in which the leading end of the first board 16 is fixed to the frame member 14, and then the first connector 50 and the second connector 52 are connected, and the second board 18 attached to the frame member 14. In such a structure of the first comparative example, the second board 18 needs to be made movable with respect to the frame member 14 in order to secure connection performance between the first connector 50 and the second connector 52. The positioning precision of the second board 18 with respect to the frame member 14 is accordingly dependent on the positioning precision of the first board 16 with respect to the frame member 14.

However, in the present exemplary embodiment, the positioning precision of the second board 18 with respect to the frame member 14 is independent of the positioning precision of the first board 16 with respect to the frame member 14. A higher positioning precision of the second board 18 with respect to the frame member 14 can accordingly be secured.

Note that from the perspective of raising the attachment precision of the second board 18 to the frame member 14, the following structures might for example be adopted as a second comparative example or a third comparative example.

Namely, a structure in which the leading end of the second board 18 is fixed to the frame member 14, and then the first board 16 is attached onto the second board 18 from the opposite side to the frame member 14 (this is the second comparative example). Or, a structure may be adopted in which the first board 16 is first fixed to the second board 18 and then the second board 18 is fixed to the frame member 14 (this is the third comparative example).

However, in the second comparative example, a fixing is used to fix the first board 16 to the second board 18, leading to an increase in the number of assembly processes and higher cost. More specifically, the mounting space, such as for electronic components that are bodies to be mounted the first board 16 and the second board 18 is reduced by such a fixing. Moreover, sometimes a tool or jig would be used to fix the first board 16 to the second board 18.

In the third exemplary embodiment too, a fixing is used to fix the first board 16 to the second board 18, leading to an increase in the number of assembly processes and higher cost, and the mounting space of the first board 16 and the second board 18, such as for electronic components, is reduced. Moreover, in the third comparative example, an operation to invert the board is also used when fixing of the first board 16 and the second board 18 is performed by screws.

However, in contrast thereto, in the present exemplary embodiment, the first board 16 is attached to the frame member 14 by sandwiching between the frame member 14 and the second board 18. There is accordingly no need for a fixing to fix the boards of the first board 16 and the second board 18 to each other, enabling the space for component mounting to be increased on the first board 16 and the second board 18. A smaller number of components is also sufficient due to not using such a fixing. In addition, in the present exemplary embodiment, there is no need for a tool or jig to fix the first board 16 to the second board 18 in order to connect the second board 18 to the first board 16 retained by the frame member 14.

Moreover, when compared to the third comparative example, in the third comparative example, as described above, a fixing operation of the first board 16 and the second board 18 using screws, and an operation to invert the board is needed, however the present exemplary embodiment does not need either the fixing operation or the inverting operation. Therefore the number of processes is smaller in the overall process of assembling the first board 16 and the second board 18 to the frame member 14.

Moreover, in the present exemplary embodiment, the pins 38 are provided extending out in a direction normal to the bottom wall 20 (in the facing direction of the first board 16 and the second board 18). It is accordingly possible to easily accomplish the insertion operation of the pins 38 into the insertion holes 40 by moving the first board 16 with respect to the frame member 14 so as to approach the bottom wall 20 in an orientation that is substantially parallel to the bottom wall 20.

Moreover, in processes to attach the first board 16 and the second board 18 to the frame member 14 these boards are stacked in sequence from the same direction (height direction). The assembly process is accordingly easier than with a structure in which, for example, two boards are mounted to a frame member from different directions.

The electronic device unit 12 with the first board 16 and the second board 18 attached to the frame member 14 (with the first connector 50 and the second connector 52 connected) is then, as illustrated in FIG. 11, attached to a specific position of the casing 114.

Note that in FIG. 11 a structure is illustrated in which two of the electronic device units 12 are attached to a single casing 114. Illustration is of a state in which one of the electronic device units 12 has already been attached to the casing 114, and the other of the electronic device units 12 is illustrated prior to attachment to the casing 114.

When this is performed, as illustrated in FIG. 12, first the rail protrusions 128 formed to the bottom wall 20 and the top wall 118 of the casing 114 are housed in the rail indentations 130 formed in the external frame walls 22, 24 of the frame member 14. In such a state, the frame member 14 is slid in the arrow M3 direction, enabling the third connectors 54 and the fourth connectors 126 to be fitted together and connected.

In particular, in the present exemplary embodiment, the sliding direction of the frame member 14 to approach the third boards 124 (the horizontal direction) matches the connection direction of the third connectors 54 and the fourth connectors 126. The third connectors 54 are accordingly able to approach and connect to the fourth connectors 126 along the sliding direction, and operation is easier than in structures in which this sliding direction (the horizontal direction) and the connection direction do not match.

Consequently, connection of the third connectors 54 and the fourth connectors 126 is secured by the positional relationship between the frame member 14 (the rail indentations 130) and the rail protrusions 128. In the present exemplary embodiment, the clearance C3 provided between the rail indentations 130 and the rail protrusions 128 is set small, enabling the third connectors 54 to be connected to the fourth connectors 126 with high positioning precision while sliding the frame member 14 smoothly in the arrow M3 direction.

Moreover, due to securing a high positioning precision of the second board 18 with respect to the frame member 14, it is possible to reliably connect even connectors (called orthogonal connectors) that demand a high positioning precision such as the third connectors 54 and the fourth connectors 126 employed in the present exemplary embodiment.

Direct connection of the second board 18 and the third boards 124 together orthogonally as viewed in the connection direction (the arrow A2 direction) is accordingly enabled by employing the orthogonal connectors. A relay board is accordingly not used for connection between the second board 18 and the third boards 124. Although a relay board is often disposed as a plate shaped member inside a casing, in the present exemplary embodiment there is no such plate shaped member present in the casing 114. The resistance to cooling air passing through inside the casing 114 is accordingly lower. It is accordingly possible, for example, to obtain the cooling effect using a smaller number of cooling fans or lower flow rate, enabling a reduction in noise and a reduction in power consumption to be achieved. The electronic device 112 with a smaller number of components is also enabled due to reducing the number of cooling fans and omitting a relay board itself.

Note that possible examples of the electronic device 112 include, for example, a personal computer, a large-sized computer, and a server. The second board 18 is fixed with high positioning precision with respect to the frame member 14, thereby enabling accurate connection between the second board 18 and the third boards 124 in the electronic device 112.

In particular, sometimes a large amount of heat is generated in mainframe computers, servers and the like that have high densities of electronic components mounted on boards (including the first board 16, the second board 18 and the third boards 124 described above, but not limited thereto). In the present exemplary embodiment, such an electronic device 112 that generates a large amount of heat has a smaller number of components, enabling efficient cooling.

As described above, the housing hole 30 is formed to the side wall portion 26 of the frame member 14, and the clearance C1 is provided between the housing hole 30 and the one width direction end portion 16A side of the first board 16 (insertion portion). Namely, it is possible to retain the first board 16 so as to be capable of moving while restricting movement of the first board 16 in the horizontal direction using a simple structure in which the housing hole 30 is provided in the frame member 14.

In particular, in an attached state of the first board 16, the side wall portion 26 provided with the housing hole 30 extends along the one width direction end portion 16A side of the first board 16. Providing the housing hole 30 in the side wall portion 26 thereby enables a structure to be realized in which the one width direction end portion 16A side of the first board 16 is easily housed.

Similarly, the pins 38 are provided extending out from the frame member 14, and the clearance C2 is provided between the pins 38 and the insertion holes 40 of the other width direction end portion 16B of the first board 16. Namely, it is possible to retain the first board 16 such that a portion of the first board 16 is movable using a simple structure provided with the pins 38 of the frame member 14 and the insertion holes 40 of the first board 16.

In particular, the pins 38 project out in a direction normal to the bottom wall 20. The pins 38 are accordingly able to be inserted into the insertion holes 40 by manipulating the first board 16 in a state facing towards the bottom wall 20 so as to approach the bottom wall 20.

Moreover, in the present exemplary embodiment, the bearing portions 32 and the stopper 34 are provided in the housing hole 30. Portions of the first board 16 are accordingly capable of being supported by face-to-face contact with the bearing portions 32. Moreover, the upwards moved first board 16 makes face-to-face contact with the stopper 34, thereby also enabling such movement to be restricted.

The bearing portions 32 and the stopper 34 are formed by locally fold-bending local portions of the side wall portion 26. The number of components in the present exemplary embodiment is accordingly smaller than in a structure in which the bearing portions 32 and the stopper 34 are provided as separate bodies. An operation to attach such separate bearing portions and stoppers to the frame member is also not needed.

An example has been given above of the rail protrusions 128 housed in the rail indentations 130 as guide members, however a guide member is not limited thereto. For example, a pair of guide walls facing along the left and right direction in FIG. 12 may be provided to the external frame walls 22, 24 of the frame member 14.

Explanation has been given of an exemplary embodiment of technology disclosed herein, however the technology disclosed herein is not limited to the above, and obviously various other modifications may be implemented within a range not departing from the spirit of technology disclosed herein.

According to the technology disclosed herein, a higher attachment precision with respect to a frame member is enabled for a board that is attached later to the frame member.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

All cited documents, patent applications and technical standards mentioned in the present specification are incorporated by reference in the present specification to the same extent as if the individual cited documents, patent applications and technical standards were specifically and individually incorporated by reference in the present specification.

What is claimed is:

1. An electronic device unit comprising:
   a frame member;
   a first board that is retained so as to be capable of moving, with respect to the frame member, in a horizontal direction of the frame member within a range restricted by a movement restricting portion;
   a facing wall portion that is included in the frame member and that is disposed facing towards the first board;
   a first connector provided to the first board;
   a second board that faces the first board in the horizontal direction and that is positioned with respect to and fixed to the frame member in a state in which the first board is disposed between the second board and the facing wall portion; and
   a second connector that is provided to the second board and that is connected to the first connector in the fixed state of the second board.

2. The electronic device unit of claim 1, wherein the movement restricting portion is a contact portion that is provided to the frame member and that contacts the first board when the first board has moved in the horizontal direction and restricts movement of the first board.

3. The electronic device unit of claim 1, further comprising:
   a pin that configures the contact portion and that is provided to the frame member so as to project out in a direction that faces the first board; and
   an insertion hole that is provided to the first board and into which the pin is inserted with clearance.

4. The electronic device unit of claim 1, wherein the inner peripheral face of the insertion hole is a face that slopes such that the internal diameter of the insertion hole decreases in a direction of insertion of the pin into the insertion hole.

5. The electronic device unit of claim 3, wherein a plurality of the pins are provided projecting out in a normal direction to the facing wall portion.

6. The electronic device unit of claim 1, wherein a housing hole is provided to the frame member so as to open in the horizontal direction, and so that there is clearance present between the housing hole and the first board in a direction orthogonal to the opening direction, with part of the first board housed in the housing hole.

7. The electronic device unit of claim 6, wherein
   the frame member includes a side wall portion extending along one end portion of the first board; and
   the housing hole is formed in the side wall portion.

8. The electronic device unit of claim 7, wherein a lower edge portion of the housing hole includes a bearing portion that faces towards a portion on the one end portion side at the opposite side of the first board to the second board.

9. The electronic device unit of claim 8, wherein the bearing portion is formed by fold-bending a portion of the side wall portion.

10. The electronic device unit of claim 1, wherein the first connector is provided at another end portion side of the first board on the opposite side of the first board to the one end portion side.

11. The electronic device unit of claim 1, wherein the first connector and the second connector face each other.

12. The electronic device unit of claim 1, wherein a third connector is provided to the second board and is disposed with a connection direction to an external device that is in the horizontal direction of the frame member.

13. An electronic device comprising:
    the electronic device unit of claim 12;
    a casing to which the electronic device unit is attached;
    an attached-to member that is fixed to the casing and that configures the external device; and
    a fourth connector that is provided to the attached-to member and that is connected to the third connector.

14. The electronic device of claim 13, wherein a guide member is provided to the casing to guide sliding of the frame member in the horizontal direction.

15. The electronic device of claim 14, wherein the second board and a third board mounted with the fourth connector as the attached-to member are orthogonal to each other as viewed along the sliding direction.

* * * * *